United States Patent
Lai et al.

(10) Patent No.: US 6,482,709 B1
(45) Date of Patent: Nov. 19, 2002

(54) MANUFACTURING PROCESS OF A MOS TRANSISTOR

(75) Inventors: Han-Chao Lai, Taichung (TW); Hung-Sui Lin, Hsin-Ying (TW); Tao-Cheng Lu, Koashiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/900,578

(22) Filed: Jul. 6, 2001

(30) Foreign Application Priority Data

Jun. 13, 2001 (TW) ........................ 90114254 A

(51) Int. Cl.[7] ................ H01L 21/336; H01L 21/8236
(52) U.S. Cl. ................. 438/305; 438/303; 438/278
(58) Field of Search ........................ 438/303, 305, 438/278

(56) References Cited

U.S. PATENT DOCUMENTS 5,516,707 A * 5/1996 Loh et al. .................. 438/302
5,605,848 A * 2/1997 Ngaoaram ................. 438/287

OTHER PUBLICATIONS

Chou et al, "The Effects of Nitrogen Implnat into Gate Electrode on the Characteristics of Dual Gate MOSFETs with Ultra–thin Oxide and Oxynitrides", IEEE, 1997, pp. 174–177.*

Herden et al, "Supression of boron penetration through thin gate oxides by nitrogen implantation into the gate electrode", Solid State Electronics, 2001, pp. 1251–1256.*

* cited by examiner

Primary Examiner—Michael S. Lebentritt
(74) Attorney, Agent, or Firm—J.C. Patents

(57) ABSTRACT

A manufacturing method of a MOS transistor. A gate oxide layer and a polysilicon layer are successively formed on a substrate. A nitrogen ion implantation is performed to implant nitrogen ions into the contact region of the polysilicon layer with the gate dielectric layer. An annealing is performed in order to enlarge the polysilicon grains within the polysilicon layer. The polysilicon layer is patterned to form a gate. A dopant is implanted into the substrate on the sides of the gate, thereby forming a source/drain region.

9 Claims, 1 Drawing Sheet

MANUFACTURING PROCESS OF A MOS TRANSISTOR

CROSS-REFERENCE TO RELATED APPLICATION

This application claims the priority benefit of Taiwan application Ser. No. 90114254, filed Jun. 13, 2001.

BACKGROUND OF THE INVENTION

1. Field of the Invention

The present invention relates to a semiconductor process. More particularly, the present invention relates to a manufacturing process of a MOS transistor.

2. Description of the Related Art

In the related art of the manufacturing process of a MOS transistor, a gate oxide layer and a polysilicon layer are successively formed on a substrate. An annealing is performed in order to enlarge the polysilicon grains within the polysilicon layer. The polysilicon layer is patterned to form a gate. A dopant is doped into the substrate on the two sides of the gate, thereby forming a source/drain region.

However, during the annealing step of the manufacturing process of a MOS transistor in the related art, the polysilicon located near the newly formed grain boundary reacts with the gate oxide and produces volatile SiO, therefore the gate oxide near the grain boundary is damaged and the entire gate oxide layer has an uneven thickness.

When the device gradually increases in integration, the thickness of the ate oxide layer decreases correspondingly. When the gate oxide layer is thinner, the effects of uneven thickness mentioned above become more apparent. For example, if the variation of the thickness ranges from approximately 6 Å to 10 Å in the annealing process and the thickness of the gate oxide layer is approximately 100 Å, the degree of variation in the thickness of the gate oxide layer is merely about 10%, thus the device still has enough stability. However, if the thickness of the gate oxide layer is reduced to about 25 Å, the degree of variation in the thickness of the gate oxide layer is increased to about 50%, and the device stability is greatly reduced.

Moreover, during the annealing step in the related art, the dopant located in the gate is very easily driven to the underlying substrate under the dual influence of high temperature and the polysilicon grain enlargement. Therefore, the electrical properties of the device are changed, which makes the device defective and lowers the yields.

SUMMARY OF THE INVENTION

The invention provides a manufacturing process of a MOS transistor. A gate dielectric layer and a polysilicon layer are successively formed on a substrate. Nitrogen ions are implanted into the contact region of the polysilicon layer with the dielectric layer. An annealing is performed in order to enlarge the polysilicon grains within the polysilicon layer. The polysilicon layer is patterned to form a gate. A dopant is doped into the substrate on the two sides of the gate, thereby forming a source/drain region.

The invention also provides a manufacturing process of a gate. A gate dielectric layer and a polysilicon layer are successively formed on the substrate. An annealing is performed in order to enlarge the polysilicon grains within the polysilicon layer. The polysilicon layer is patterned to form a gate.

In the manufacturing process of a MOS transistor provided in the present invention, when the annealing is performed to enlarge the grain within the polysilicon layer, the nitrogen implanted suppresses the growth of the grain boundary in the contact region of the polysilicon layer with the gate oxide layer. Therefore, the amount of damage to the gate dielectric layer caused by the grain boundary is effectively reduced, and the gate oxide layer does not become uneven. The degree of variation in the thickness of the gate oxide layer is reduced and device stability is increased.

Moreover, in the manufacturing process of a MOS transistor provided in the present invention, when the annealing is performed to enlarge the polysilicon grains within the polysilicon layer, the dopant within the polysilicon layer does not diffuse into the underlying substrate due to the resistance of the thin nitrogen-containing region at the bottom of the gate. For this reason, changes in the electrical properties of the device are prevented, which increases the yields.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 1:
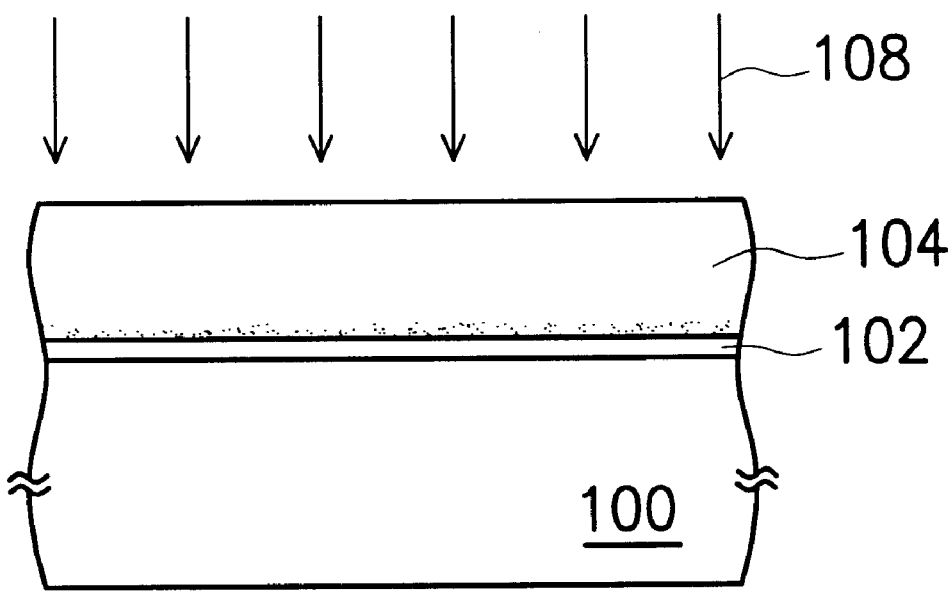
FIGS. 1 and 2 are flow diagrams in cross-sectional view according to one preferred embodiment of the manufacturing process of a MOS transistor in the present invention.
Figure 2:
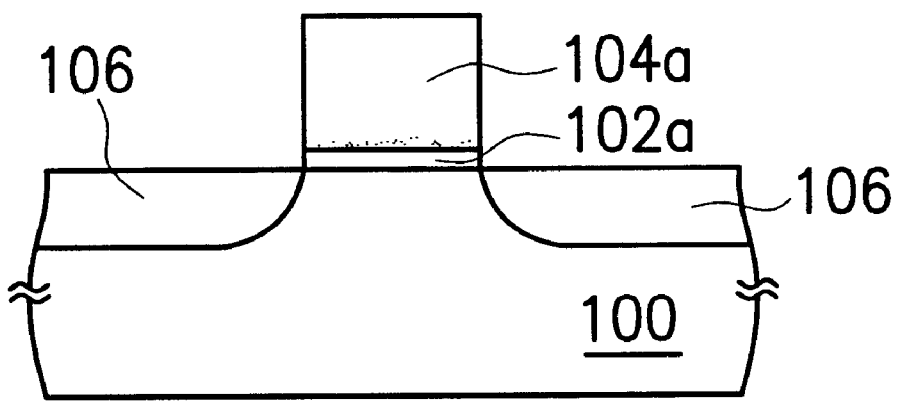

FIGS. 1 and 2 are illustrations in cross-sectional view according to one preferred embodiment of the manufacturing process of a MOS transistor in the present invention. Referring to FIG. 1, a substrate 100 is provided, then a gate dielectric layer 102 and a polysilicon layer 104 are successively formed on the substrate 100. The material of the gate dielectric layer 102 includes silicon dioxide.

Referring to FIG. 2, nitrogen ions 108 are implanted into the contact region of the polysilicon layer 104 with the gate dielectric layer 102. The dosage and the energy of the implantation are adjusted as required according to the actual conditions.

An annealing is performed in order to enlarge the grains within the polysilicon layer 104. A lithography and etching process is then performed to pattern the polysilicon layer 104 into a gate 104a. After that, an ion implantation is performed to form a source/drain region 106 in the substrate 100 on the two sides of the gate 104a. The dopant can be boron ion, arsenic ion or phosphorus ion. The step of patterning the polysilicon 104 can also be performed prior to the annealing.

In the present invention, nitrogen ions are implanted into the contact region of the gate 104a with the gate dielectric layer 102a. Thus, when annealing is performed to enlarge the grain within the polysilicon layer, the nitrogen implanted suppresses the growth of the grain boundary in the contact region of the polysilicon layer with gate oxide layer. Therefore, the amount of damage to the gate dielectric layer caused by the grain boundary is effectively reduced, and the gate oxide layer does not become uneven. Since the degree of variation in the thickness of the gate dielectric layer is reduced, the stability of the device is increased.

Moreover, in the manufacturing process of a MOS transistor provided in the present invention, when the annealing is performed to enlarge the polysilicon grains within the polysilicon layer, the dopant within the polysilicon layer does not diffuse into the underlying substrate. Consequently, changes in the electric properties of the device are prevented, which increases the yields.

In addition, the nitrogen ion implantation in the invention can be performed prior to the annealing and after the step of patterning the polysilicon layer. Besides, the annealing can be performed just after the step of patterning the polysilcon layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a MOS transistor, comprising:

providing a substrate, wherein a gate dielectric layer and a polysilicon layer are successively formed on the substrate;

performing a nitrogen ion implantation, wherein the nitrogen ions are implanted into the contact region of the polysilicon layer with the gate dielectric layer;

performing an annealing in order to enlarge the grains in the polysilicon layer;

patterning the polysilicon layer in order to form a gate; and forming a source/drain region on the two sides of the gate.

2. The method of claim 1, wherein a dopant in the source/drain region comprises boron, arsenic or phosphorus.

3. The method of claim 1, wherein the gate dielectric layer is made of a material including silicon dioxide.

4. The method of claim 1, wherein the step of patterning the polysilicon layer is performed after the nitrogen ion implantation and prior to the annealing.

5. The method of claim 1, wherein the step of patterning the polysilicon layer is performed before the nitrogen ion implantation.

6. A manufacturing method of a MOS transistor, comprising:

providing a substrate, wherein a gate dielectric layer and a polysilicon layer are successively formed upon the substrate;

performing a nitrogen ion implantation, wherein the nitrogen ions are implanted into the contact region of the polysilicon layer with the gate dielectric layer;

performing an annealing in order to enlarge the grains within the polysilicon layer; and patterning the polysilicon layer in order to form a gate.

7. The method of claim 6, wherein the gate dielectric layer is made of a material including silicon dioxide.

8. The method of claim 6, wherein the step of patterning the polysilicon layer is performed after the nitrogen ion implantation and prior to the annealing.

9. The method of claim 6, wherein the step of patterning the polysilicon layer is performed prior to the nitrogen ion implantation.

* * * * *